(12) United States Patent
Pan et al.

(10) Patent No.: US 11,177,231 B2
(45) Date of Patent: Nov. 16, 2021

(54) BONDING CONTACTS HAVING CAPPING LAYER AND METHOD FOR FORMING THE SAME

(71) Applicant: YANGTZE MEMORY TECHNOLOGIES CO., LTD., Wuhan (CN)

(72) Inventors: Jie Pan, Wuhan (CN); Shu Liang Lv, Wuhan (CN); Liang Ma, Wuhan (CN); Yuan Li, Wuhan (CN); Si Ping Hu, Wuhan (CN); Xianjin Wan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 18 days.

(21) Appl. No.: 16/140,476

(22) Filed: Sep. 24, 2018

(65) Prior Publication Data

US 2020/0051945 A1    Feb. 13, 2020

Related U.S. Application Data

(63) Continuation of application No. PCT/CN2018/100218, filed on Aug. 13, 2018.

(51) Int. Cl.
*H01L 23/00* (2006.01)
*H01L 27/1157* (2017.01)
(Continued)

(52) U.S. Cl.
CPC ............. *H01L 24/25* (2013.01); *H01L 24/19* (2013.01); *H01L 24/82* (2013.01); *H01L 24/83* (2013.01);
(Continued)

(58) Field of Classification Search
CPC ............. H01L 2224/08145–08147; H01L 2224/08501; H01L 2224/0903;
(Continued)

(56) References Cited

U.S. PATENT DOCUMENTS 10,283,493 B1 * 5/2019 Nishida ............. H01L 27/11573
2005/0067701 A1 * 3/2005 Coolbaugh ......... H01L 23/5223
257/751

(Continued)

FOREIGN PATENT DOCUMENTS

CN    101160661 A    4/2008
CN    102543778 A    7/2012
TW    201128745 A    8/2011

OTHER PUBLICATIONS

International Search Report issued in corresponding International Application No. PCT/CN2018/100218, dated May 8, 2019, 4 pages.
(Continued)

*Primary Examiner* — Alia Sabur
(74) *Attorney, Agent, or Firm* — Bayes PLLC

(57) ABSTRACT

Embodiments of bonded semiconductor structures and fabrication methods thereof are disclosed. In an example, a semiconductor device includes a first semiconductor structure, a second semiconductor structure, and a bonding interface between the first and second semiconductor structures. The first semiconductor structure includes a substrate, a first device layer disposed on the substrate, and a first bonding layer disposed above the first device layer and including a first bonding contact. The second semiconductor structure includes a second device layer, and a second bonding layer disposed below the second device layer and including a second bonding contact. The first bonding contact is in contact with the second bonding contact at the bonding interface. At least one of the first bonding contact and the second bonding contact includes a capping layer at (Continued)

the bonding interface and having a conductive material different from a remainder of the respective first or second bonding contact.

17 Claims, 10 Drawing Sheets

(51) Int. Cl.
*H01L 27/11573* (2017.01)
*H01L 27/11582* (2017.01)

(52) U.S. Cl.
CPC .... *H01L 27/1157* (2013.01); *H01L 27/11573* (2013.01); *H01L 27/11582* (2013.01)

(58) Field of Classification Search
CPC . H01L 2224/05564; H01L 2224/05571; H01L 21/187; H01L 21/76849; H01L 2224/05007; H01L 24/89; H01L 2224/80895; H01L 2224/80894; H01L 21/28562; H01L 23/53238; H01L 2224/13562; H01L 2224/1354
See application file for complete search history.

(56) References Cited

U.S. PATENT DOCUMENTS

| | | | |
|---|---|---|---|
| 2005/0156278 A1 | 7/2005 | Coolbaugh et al. | |
| 2007/0105377 A1* | 5/2007 | Koos | H01L 21/76858 |
| | | | 438/689 |
| 2009/0269507 A1* | 10/2009 | Yu | H01L 21/2855 |
| | | | 427/535 |
| 2012/0153484 A1 | 6/2012 | Sadaka | |
| 2012/0252189 A1* | 10/2012 | Sadaka | H01L 21/187 |
| | | | 438/455 |
| 2013/0200520 A1* | 8/2013 | Nguyen | H01L 24/83 |
| | | | 257/753 |
| 2015/0021789 A1 | 1/2015 | Lin | |
| 2015/0340269 A1* | 11/2015 | Rivoire | H01L 25/0657 |
| | | | 257/751 |
| 2019/0123006 A1* | 4/2019 | Chen | H01L 24/08 |

OTHER PUBLICATIONS

Written Opinion of the International Searching Authority issued in corresponding International Application No. PCT/CN2018/100218, dated May 8, 2019, 5 pages.

\* cited by examiner

BONDING CONTACTS HAVING CAPPING LAYER AND METHOD FOR FORMING THE SAME

CROSS REFERENCE TO RELATED APPLICATION

This application is continuation of International Application No. PCT/CN2018/100218, filed on Aug. 13, 2018, entitled "BONDING CONTACTS HAVING CAPPING LAYER AND METHOD FOR FORMING THE SAME," which is hereby incorporated by reference in its entirety.

BACKGROUND

Embodiments of the present disclosure relate to bonded semiconductor structures and fabrication methods thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor substrates, hybrid bonding is recognized as one of the promising techniques because of its capability of forming high-density interconnects.

SUMMARY

Embodiments of semiconductor devices, bonded structures, and fabrication methods thereof are disclosed herein.

In one example, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact. The second semiconductor structure includes a second device layer, and a second bonding layer disposed below the second device layer and including a second bonding contact. The first bonding contact is in contact with the second bonding contact at the bonding interface. At least one of the first bonding contact and the second bonding contact includes a capping layer at the bonding interface and having a conductive material different from a remainder of the respective first or second bonding contact.

In another example, a bonded structure includes a first bonding layer including a first bonding contact and a first dielectric, a second bonding layer including a second bonding contact and a second dielectric, and a bonding interface between the first bonding layer and the second bonding layer. The first bonding contact is in contact with the second bonding contact at the bonding interface, and the first dielectric is in contact with the second dielectric at the bonding interface. At least one of the first bonding contact and the second bonding contact includes a capping layer at the bonding interface and having a conductive material different from a remainder of the respective first or second bonding contact.

In a different example, a method for forming a semiconductor device is disclosed. A first device layer is formed on a first substrate. A first bonding layer including a first bonding contact is formed above the first device layer. A first capping layer is formed at an upper end of the first bonding contact. The first capping layer has a conductive material different from a remainder of the first bonding contact. A second device layer is formed on a second substrate. A second bonding layer including a second bonding contact is formed above the second device layer. The first substrate and the second substrate are bonded in a face-to-face manner, so that the first bonding contact is in contact with the second bonding contact by the first capping layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
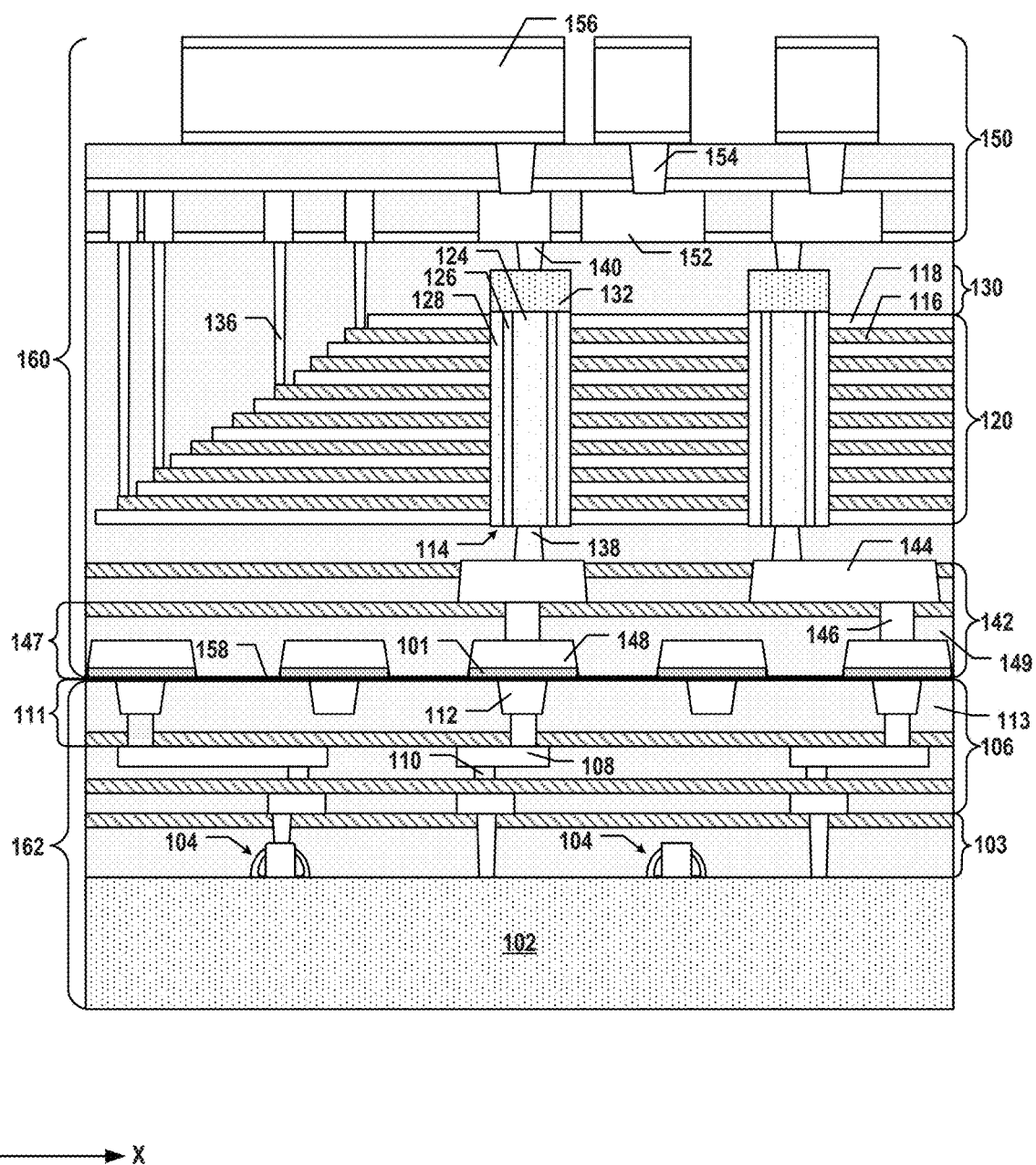
FIG. 1 illustrates a cross-section of an exemplary semiconductor device including bonding contacts having a capping layer, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In the high density, low feature size (e.g., 100 nm) hybrid bonding process, metals of bonding contacts in the two semiconductor structures used as the conductor layer include copper. Copper migration, however, can happen during the hybrid bonding process due to thermal expansion and thus, can lead to void formation in the bonding contacts after bonding. Moreover, diffusion of copper at the bonding interface is another problem for hybrid bonding, which can cause leakage and shorten electromigration (EM) life of the bonded structure.

Various embodiments in accordance with the present disclosure provide bonding contacts having a capping layer for improving hybrid bonding process interface. The capping layer can prevent copper diffusion through the bonding interface, thereby reducing leakage and increasing EM life of the bonded structure. Moreover, by reducing volume change, the capping layer can reduce the voids formed after hybrid bonding due to copper migration and volume shrink. For example, the capping layer can fill in the recess of a bonding contact caused by dishing at the bonding interface after chemical mechanical polishing (CMP). In some embodiments, by using a conductive material (e.g., cobalt) with a high selectivity between bonding contact the surrounding dielectric, the capping layer can be selectively deposited only at the upper end of the bonding contact, which simplifies the fabrication process of the capping layer.

FIG. 1 illustrates a cross-section of an exemplary semiconductor device 100 including bonding contacts 148 having a capping layer 101, according to some embodiments of the present disclosure. For ease of description, semiconductor device 100 will be described as a non-monolithic 3D memory device. However, it is understood that semiconductor device 100 is not limited to a 3D memory device and can include any suitable semiconductor devices that can use capping layer(s) to improve bonding interface properties as described below in detail.

Semiconductor device 100 represents an example of a non-monolithic 3D memory device. The term "non-monolithic" means that the components of semiconductor device 100 (e.g., peripheral devices and memory array devices) can be formed separately on different substrates and then bonded to form a bonded semiconductor device. Semiconductor device 100 can include a substrate 102, which can include silicon (e.g., single crystalline silicon), silicon germanium (SiGe), gallium arsenide (GaAs), germanium (Ge), silicon on insulator (SOI), or any other suitable materials.

Semiconductor device 100 can include a peripheral device layer 103 on substrate 102. Peripheral device layer 103 can include a plurality of transistors 104 formed on substrate 102. Transistors 104 can be formed "on" substrate 102, where the entirety or part of each transistor 104 is formed in substrate 102 (e.g., below the top surface of substrate 102) and/or directly on substrate 102. Isolation regions (e.g., shallow trench isolations (STIs), not shown) and doped regions (e.g., source regions and drain regions of transistors 104, not shown) can be formed in substrate 102 as well.

In some embodiments, peripheral device layer 103 can include any suitable digital, analog, and/or mixed-signal peripheral circuits used for facilitating the operation of semiconductor device 100. For example, peripheral device layer 103 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, peripheral device layer 103 is formed on substrate 102 using complementary metal-oxide-semiconductor (CMOS) technology (also known as a "CMOS chip").

Semiconductor device 100 can include an interconnect layer 106 (referred to herein as a "peripheral interconnect layer") above peripheral device layer 103 to transfer electrical signals to and from peripheral device layer 103. Peripheral interconnect layer 106 can include a plurality of interconnects (also referred to herein as "contacts"), including lateral interconnect lines 108 and vertical interconnect access (via) contacts 110. As used herein, the term "interconnects" can broadly include any suitable types of interconnects, such as middle-end-of-line (MEOL) interconnects and back-end-of-line (BEOL) interconnects. Peripheral interconnect layer 106 can further include one or more interlayer dielectric (ILD) layers (also known as "intermetal dielectric (IMD) layers") in which interconnect lines 108 and via contacts 110 can form. That is, peripheral interconnect layer 106 can include interconnect lines 108 and via contacts 110 in multiple ILD layers. Interconnect lines 108 and via contacts 110 in peripheral interconnect layer 106 can include conductive materials including, but not limited to, tungsten (W), cobalt (Co), copper (Cu), aluminum (Al), silicides, or any combination thereof. The ILD layers in peripheral interconnect layer 106 can include dielectric materials including, but not limited to, silicon oxide, silicon nitride, silicon oxynitride, low dielectric constant (low-k) dielectrics, or any combination thereof.

In some embodiments, peripheral interconnect layer 106 further includes a bonding layer 111 at its top portion. Bonding layer 111 can include a plurality of bonding contacts 112 and a dielectric 113 electrically isolating bonding contacts 112. Bonding contacts 112 can include conductive materials including, but not limited to, W, Co, Cu, Al, silicides, or any combination thereof. The remaining area of bonding layer 111 can be formed with dielectrc 113 including, but not limited to, silicon oxide, silicon nitride, silicon oxynitride, low-k dielectrics, or any combination thereof.

Bonding contacts 112 and dielectric 113 in bonding layer 111 can be used for hybrid bonding as described below in detail.

Semiconductor device 100 can include a memory array device layer 120 above peripheral device layer 103. It is noted that x and y axes are included in FIG. 1 to further illustrate the spatial relationship of the components in semiconductor device 100. Substrate 102 includes two lateral surfaces (e.g., a top surface and a bottom surface) extending laterally in the x-direction (i.e., the lateral or width direction). As used herein, whether one component (e.g., a layer or a device) is "on," "above," or "below" another component (e.g., a layer or a device) of a semiconductor device (e.g., semiconductor device 100) is determined relative to the substrate of the semiconductor device (e.g., substrate 102) in the y-direction (i.e., the vertical or thickness direction) when the substrate is positioned in the lowest plane of the semiconductor device in the y-direction. The same notion for describing spatial relationship is applied throughout the present disclosure.

In some embodiments, semiconductor device 100 is a NAND Flash memory device in which memory cells are provided in the form of an array of NAND memory strings 114 each extending vertically above peripheral device layer 103. Memory array device layer 120 can include NAND memory strings 114 that extend vertically through a plurality of pairs each including a conductor layer 116 and a dielectric layer 118 (referred to herein as "conductor/dielectric layer pairs"). The stacked conductor/dielectric layer pairs are also referred to herein as a "memory stack." Conductor layers 116 and dielectric layers 118 in the memory can stack alternate in the vertical direction.

As shown in FIG. 1, each NAND memory string 114 can include a semiconductor channel 124 and a dielectric layer (also known as a "memory film"). In some embodiments, semiconductor channel 124 includes silicon, such as amorphous silicon, polysilicon, or single crystalline silicon. In some embodiments, the memory film is a composite layer including a tunneling layer 126, a storage layer 128 (also known as a "charge trap/storage layer"), and a blocking layer (not shown). Each NAND memory string 114 can have a cylinder shape (e.g., a pillar shape). Semiconductor channel 124, tunneling layer 126, storage layer 128, and the blocking layer are arranged radially from the center toward the outer surface of the pillar in this order, according to some embodiments. Tunneling layer 126 can include silicon oxide, silicon oxynitride, or any combination thereof. Storage layer 128 can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 114 further include a plurality of control gates (each being part of a word line). Each conductor layer 116 in the memory stack can act as a control gate for memory cell of each NAND memory string 114. Each NAND memory string 114 can include a source select gate at its upper end and a drain select gate at its lower end. As used herein, the "upper end" of a component (e.g., NAND memory string 114) is the end farther away from substrate 102 in the y-direction, and the "lower end" of the component (e.g., NAND memory string 114) is the end closer to substrate 102 in the y-direction.

In some embodiments, semiconductor device 100 further includes a semiconductor layer 130 disposed above and in contact with NAND memory strings 114. Memory array device layer 120 can be disposed below semiconductor layer 130. In some embodiments, semiconductor layer 130 includes a plurality of semiconductor plugs 132 electrically separated by isolation regions. In some embodiments, each semiconductor plug 132 is disposed at the upper end of corresponding NAND memory string 114 and functions as the drain of corresponding NAND memory string 114 and thus, can be considered as part of corresponding NAND memory string 114. Semiconductor plug 132 can include a single crystalline silicon. Semiconductor plug 132 can be un-doped, partially doped (in the thickness direction and/or the width direction), or fully doped by p-type or n-type dopants.

In some embodiments, semiconductor device 100 includes local interconnects that are formed in one or more ILD layers and in contact with components in memory array device layer 120, such as the word lines (e.g., conductor layers 116) and NAND memory strings 114. The local interconnects can include word line via contacts 136, source line via contacts 138, and bit line via contacts 140. Each local interconnect can include conductive materials including, but not limited to, W, Co, Cu, Al, silicides, or any combination thereof. Word line via contacts 136 can extend vertically through one or more ILD layers. Each word line via contact 136 can be in contact with corresponding conductor layer 116 to individually address a corresponding word line of semiconductor device 100. Each source line via contact 138 can be in contact with the source of corresponding NAND memory string 114. Bit line via contacts 140 can extend vertically through one or more ILD layers. Each bit line via contact 140 can electrically connect to corresponding semiconductor plug 132 (e.g., the drain) of NAND memory string 114 to individually address corresponding NAND memory string 114.

Similar to peripheral device layer 103, memory array device layer 120 of semiconductor device 100 can also include interconnect layers for transferring electrical signals to and from NAND memory strings 114. As shown in FIG. 1, semiconductor device 100 can include an interconnect layer 142 (referred to herein as an "array interconnect layer") below memory array device layer 120. Array interconnect layer 142 can include a plurality of interconnects, including interconnect lines 144 and via contacts 146 in one or more ILD layers. In some embodiments, array interconnect layer 142 includes a bonding layer 147 at its bottom portion. Bonding layer 147 can include a plurality of bonding contacts 148 and a dielectric 149 electrically isolating bonding contacts 148. Bonding contacts 148 can include conductive materials including, but not limited to, W, Co, Cu, Al, silicides, or any combination thereof. The remaining area of bonding layer 147 can be formed with dielectric 149 including, but not limited to, silicon oxide, silicon nitride, silicon oxynitride, low-k dielectrics, or any combination thereof. Bonding contacts 148 and dielectric 149 in bonding layer 147 can be used for hybrid bonding as described below in detail.

As shown in FIG. 1, another interconnect layer 150 (referred to herein as a "BEOL interconnect layer") can be disposed above memory array device layer 120 and can include interconnects, such as interconnect lines 152 and via contacts 154 in one or more ILD layers. BEOL interconnect layer 150 can further include contact pads 156 and a redistribution layer (not shown) at the top portion of semiconductor device 100 for wire bonding and/or bonding with an interposer. BEOL interconnect layer 150 and array interconnect layer 142 can be formed on opposite sides of memory array device layer 120. In some embodiments, interconnect lines 152, via contacts 154, and contact pads 156 in BEOL interconnect layer 150 can transfer electrical signals between semiconductor device 100 and external circuits.

In some embodiments, a first semiconductor structure (e.g., a memory array device chip 160), including memory array device layer 120 (and NAND memory strings 114 therein), semiconductor layer 130 (e.g., a thinned substrate), array interconnect layer 142 (and bonding layer 147 therein), and BEOL interconnect layer 150, is bonded with a second semiconductor structure (e.g., a peripheral device chip 162), including substrate 102, peripheral device layer 103 (and transistors 104 therein), and peripheral interconnect layer 106, in a face-to-face manner at a bonding interface 158.

As shown in FIG. 1, bonding interface 158 can be formed between bonding layers 111 and 147. Bonding contacts 112 are in contact with bonding contacts 148 at bonding interface 158, and dielectric 113 is in contact with dielectric 149 as well, according to some embodiments. In semiconductor device 100, bonding interface 158 is disposed between memory array device layer 120 and peripheral device layer 103, according to some embodiments. Bonding layers 111 and 147 can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding can be formed between bonding contacts 148 and bonding contacts 112, and the dielectric-dielectric bonding can be formed between dielectric 149 and dielectric 113.

As shown in FIG. 1, the width (in the x-direction) of bonding contact 148 in memory array device chip 160 is greater than the width (in the x-direction) of bonding contact 112 in peripheral device chip 162. Each bonding contact 148 can include capping layer 101 formed at its end at bonding interface 158. The width of capping layer 101 can be nominally the same as the width of bonding contact 148 at bonding interface 158. That is, capping layer 101 can extend laterally to cover the entire width of bonding contact 148 at bonding interface 158, while not extending into dielectric 149 in memory array device chip 160 at bonding interface 158. Because bonding contact 148 is wider than bonding contact 112, by covering the entire width of bonding contact 148 at bonding interface 158, capping layer 101 can completely seal both bonding contact 148 and bonding contact 112 on the opposite sides of bonding interface 158 to prevent copper diffusion from bonding contact 148 to dielectric 113 across bonding interface 158, as well as void formation caused by thermal expansion in dual directions (i.e., bottom up and top down). On the other hand, the selectivity of the conductive material of capping layer 101 can be greater on the remainder of bonding contact 148 than on dielectric 149. As a result, capping layer 101 can be selectively deposited only at the end of bonding contact 148, but not dielectric 149, at bonding interface 158 without the need of patterning, thereby reducing the process complexity and associated cost.

The thickness (in the y-direction) of capping layer 101 can be between about 1 nm and about 5 nm, such as between 1 nm and 5 nm (e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, capping layer 101 has a conductive material different from the remainder of bonding contact 148. The remainder of bonding contact 148 can include a conductor (not shown) and a barrier/adhesion layer (not shown) between the conductor and dielectric 149 surrounding bonding contact 148. The barrier/adhesion layer can improve the adhesion of the conductor on dielectric 149 and prevent the diffusion of the conductor atoms into dielectric 149. In some embodiments, the materials of the barrier/adhesion layer include, but not limited to, titanium/titanium nitride (Ti/TiN) and tantalum/tantalum nitride (Ta/TaN). In some embodiments, the conductive materials of the conductor include, but not limited to metals, such as W, Co, Cu, and Al.

In some embodiments, bonding contact 148 includes copper as its conductor, which is suitable for hybrid bonding, and capping layer 101 includes cobalt that is different from the copper conductor. Cobalt can act as a barrier between the copper conductor and dielectrics to effectively prevent copper diffusion into the dielectrics. Also, the selectivity of cobalt on copper is greater than on dielectric materials (e.g., silicon oxide), for example, by 10 times to 1,000 times (e.g., 10 times, 20 times, 30 times, 40 times, 50 times, 60 times, 70 times, 80 times, 90 times, 100 times, 200 times, 300 times, 400 times, 500 times, 600 times, 700 times, 800 times, 900 times, 1,000 times, any range bounded by the lower end by any of these values, or in any range defined by any two of these values). Moreover, the deposition of cobalt in capping layer 101 can be controlled to precisely fill in the dishing at the upper end of bonding contact 148 after CMP (e.g., with the thickness of between 1 nm and 5 nm), such that the surface of bonding contact 148 can be flush with other parts in bonding layer 111. Accordingly, capping layer 101 of bonding contact 148 can improve various properties at bonding interface 158 of semiconductor device 100.

Figure 2A:
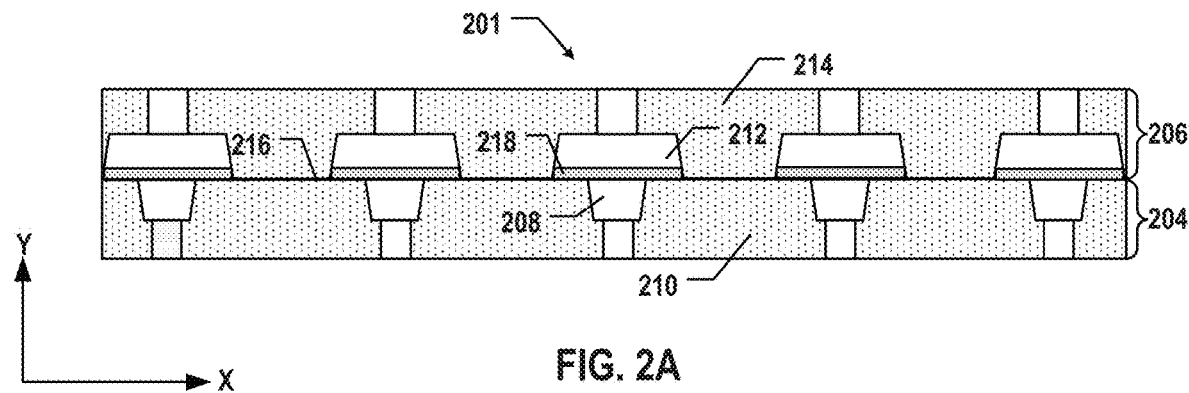
FIGS. 2A-2C illustrate cross-sections of various exemplary bonded structures having a capping layer, according to various embodiments of the present disclosure.
Figure 2B:
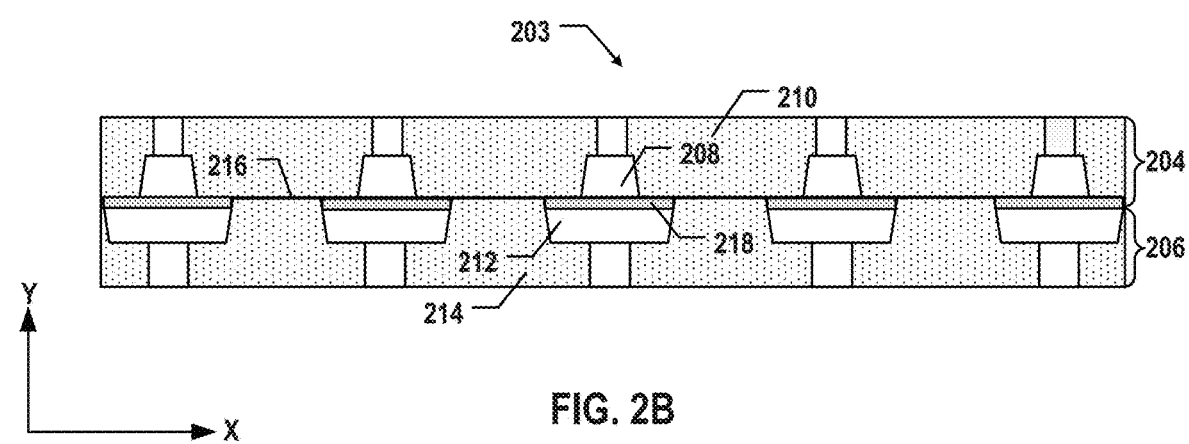
Figure 2C:
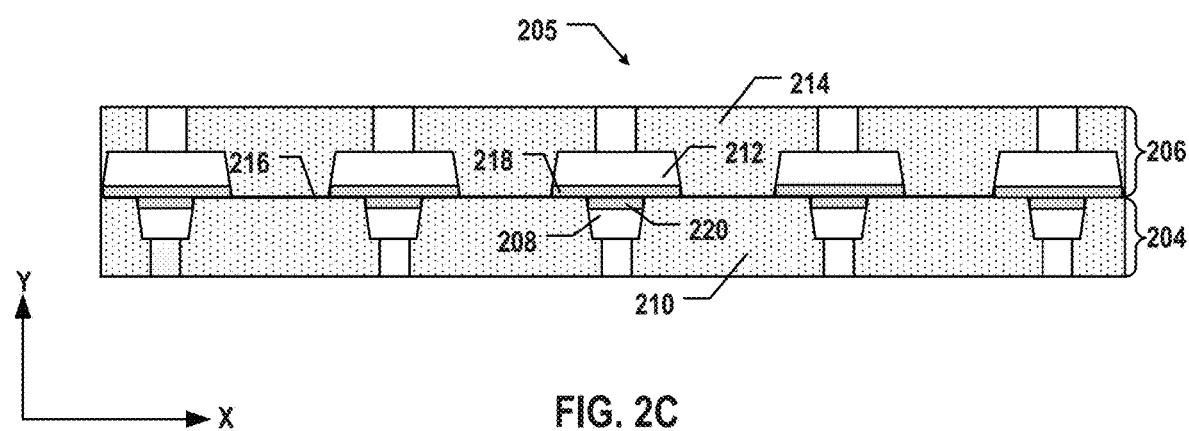

FIGS. 2A-2C illustrate cross-sections of various exemplary bonded structures having a capping layer, according to various embodiments. FIG. 1 illustrates semiconductor device 100 having capping layer 101, which includes a bonded structure of memory array device chip 160 and peripheral device chip 162. It is understood that the capping layer disclosed herein can be used in any suitable bonded structures with various arrangements. FIG. 2A illustrates a bonded structure 201 including a lower bonding layer 204 and an upper bonding layer 206, according to some embodiments. Lower bonding layer 204 can include lower bonding contacts 208 and lower dielectrics 210 electrically isolating lower bonding contacts 208. Similarly, upper bonding layer 206 can include upper bonding contacts 212 and upper dielectrics 214 electrically isolating upper bonding contacts 212. Bonded structure 201 can further include a bonding interface 216 formed between lower bonding layer 204 and upper bonding layer 206.

As shown in FIG. 2A, each upper bonding contact 212 is in contact with corresponding lower bonding contact 208, and upper dielectric 214 is in contact with lower dielectric 210. In some embodiments, upper bonding contact 212 and lower bonding contact 208 include a copper conductor, and upper dielectric 214 and lower dielectric 210 include silicon oxide. Upper bonding layer 206 can be bonded with lower bonding layer 204 by hybrid bonding, so that Cu—Cu fusion bonding between upper bonding contact 212 and lower bonding contact 208 and SiOx—SiOx covalent bonding between upper dielectric 214 and lower dielectric 210 can be formed simultaneously.

Similar to the bonded structure in FIG. 1, the width of upper bonding contact 212 is greater than the width of lower bonding contact 208. Each upper bonding contact 212 can include a capping layer 218 formed at one end at bonding interface 216. The width of capping layer 218 can be nominally the same as the width of upper bonding contact 212 at bonding interface 216. The thickness of capping layer 218 can be between about 1 nm and about 5 nm, such as between 1 nm and 5 nm (e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, capping layer 218 has a conductive material different from the remainder of upper bonding contact 212. In some embodiments, the selectivity of the conductive material of capping layer 218 is greater on the remainder of upper bonding contact 212 than on upper dielectric 214. In one example, upper bonding contact 212 includes a copper conductor, and capping layer 218 includes cobalt.

FIG. 2B illustrates a bonded structure 203 that is similar to bonded structure 201 illustrated in FIG. 2A except that the relative vertical positions of the components in the upper and lower bonding layers 206 and 204 are switched. In other words, bonded structure 201 can be flipped vertically along bonding interface 216 to become bonded structure 203. Nevertheless, capping layer 218 can still be formed at one end of the wider bonding contact (e.g., bonding contact 212) at bonding interface 216 regardless of whether the wider bonding contact is above or below bonding interface 216.

FIG. 2C illustrates a bonded structure 205 that is similar to bonded structure 201 illustrated in FIG. 2A except that each lower bonding contact 208 in lower bonding layer 204 includes a capping layer 220 as well. That is, both upper bonding contact 212 and lower bonding contact 208 include capping layers 218 and 220 at the respective end at bonding interface 216. In some embodiments, similar to capping layer 218, the width of capping layer 220 is nominally the same as the width of lower bonding contact 208 at bonding interface 216. In some embodiments, the conductive materials of both capping layers 218 and 220 are the same, such as cobalt. In some embodiments, the thickness of both capping layers 218 and 220 are substantially the same, such as between 1 nm and 5 nm. It is understood that in some embodiments, the thickness of capping layers 218 and 220 are different from one another. By having dual capping layers on the opposite sides of the bonding interface, the bonding interface properties, such as copper diffusion prevention, void formation reduction, and dishing filling, can be further improved.

It is understood that bonded structure 201, 203, or 205 can include or be combined with other structures, such as device layer(s), interconnect layer(s), and substrate(s), to form any suitable semiconductor devices, for example, logic devices, volatile memory devices (e.g., dynamic random-access memory (DRAM) and static random-access memory (SRAM)), and non-volatile memory devices (e.g., Flash memory), in a 2 D, 2.5 D, or 3 D architecture.

Figure 3A:
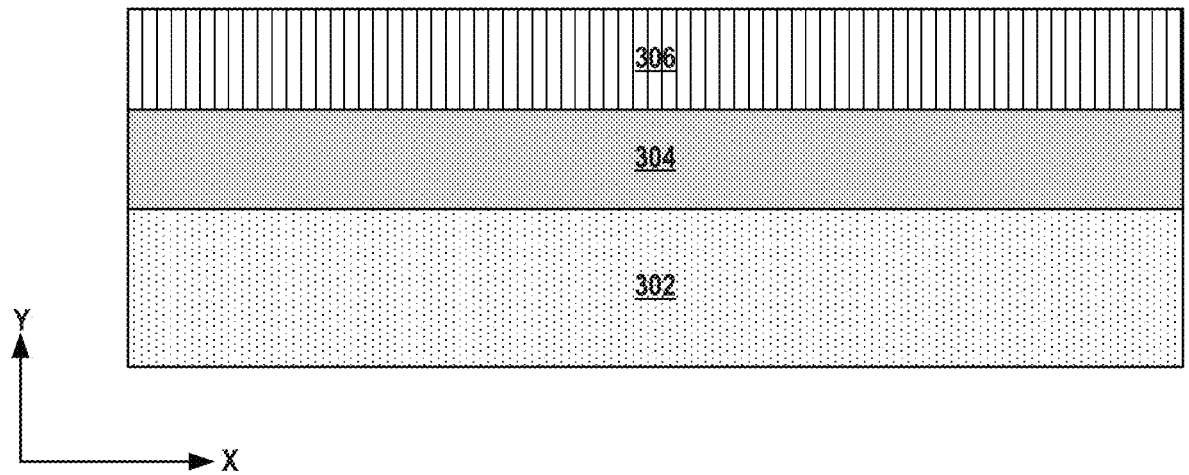
FIGS. 3A-3D illustrate an exemplary fabrication process for forming a first semiconductor structure including bonding contacts having a capping layer, according to some embodiments of the present disclosure.
Figure 3B:
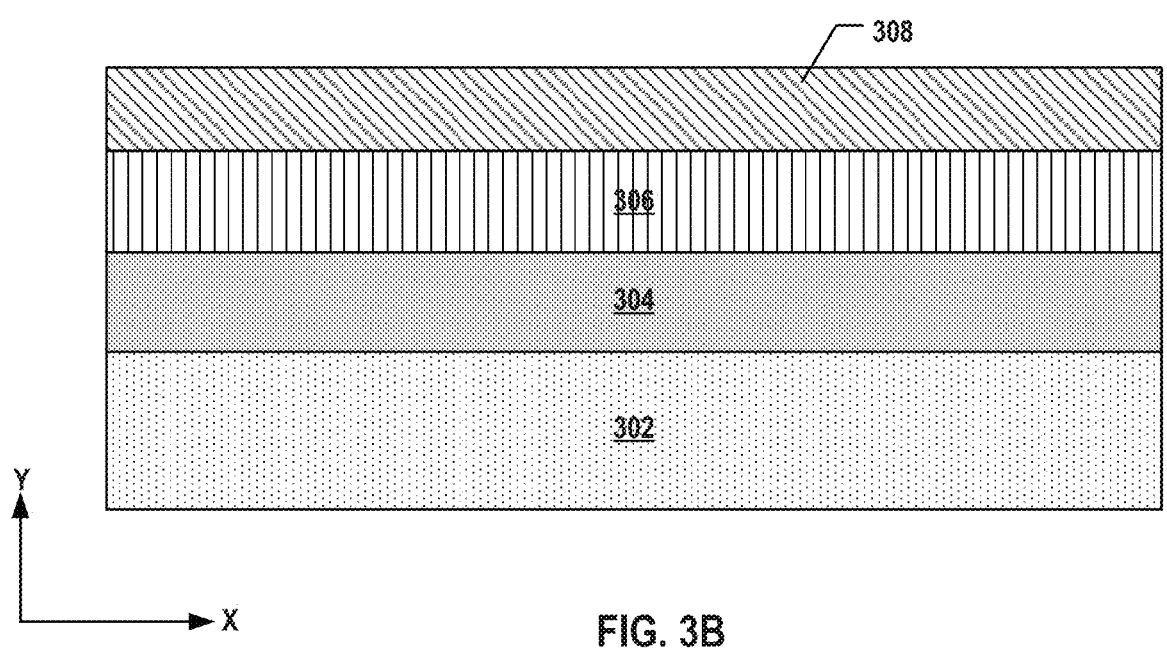
Figure 3C:
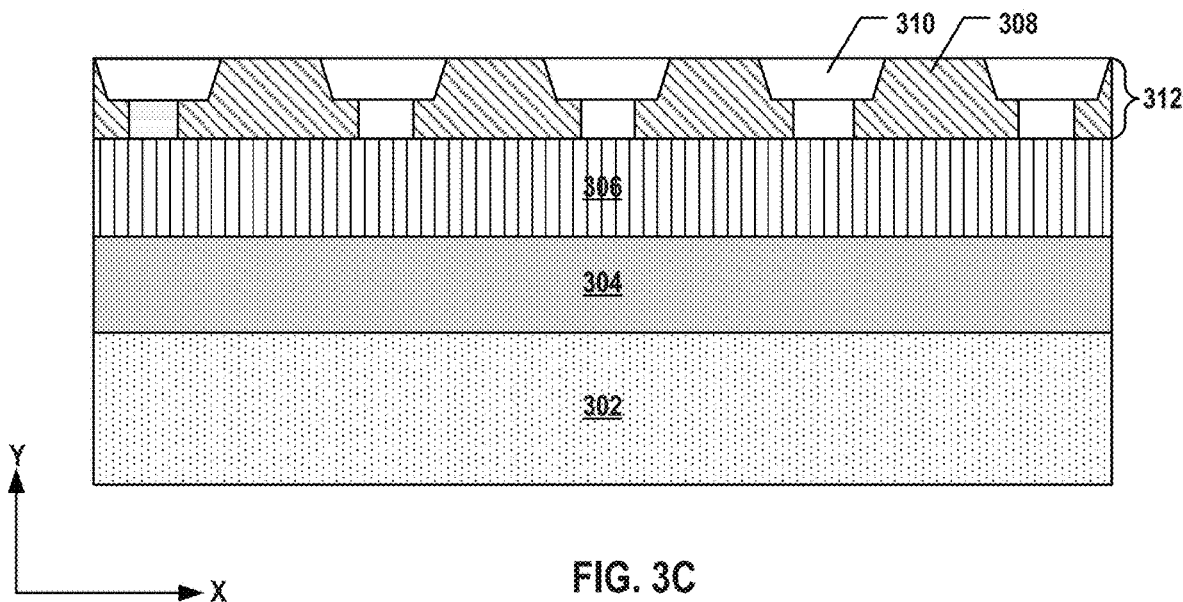
Figure 4A:
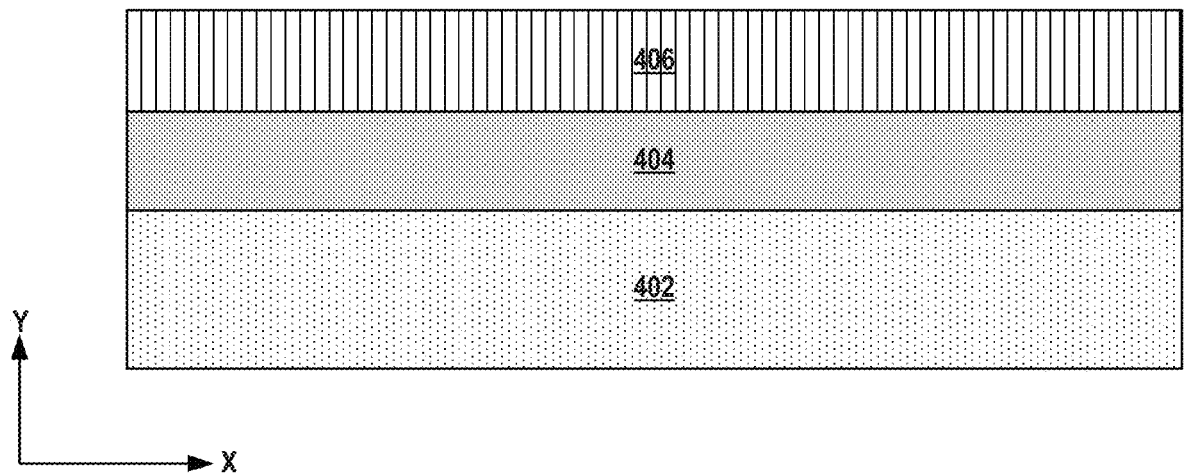
FIGS. 4A-4D illustrate an exemplary fabrication process for forming a second semiconductor structure including bonding contacts having a capping layer, according to some embodiments of the present disclosure.
Figure 5A:
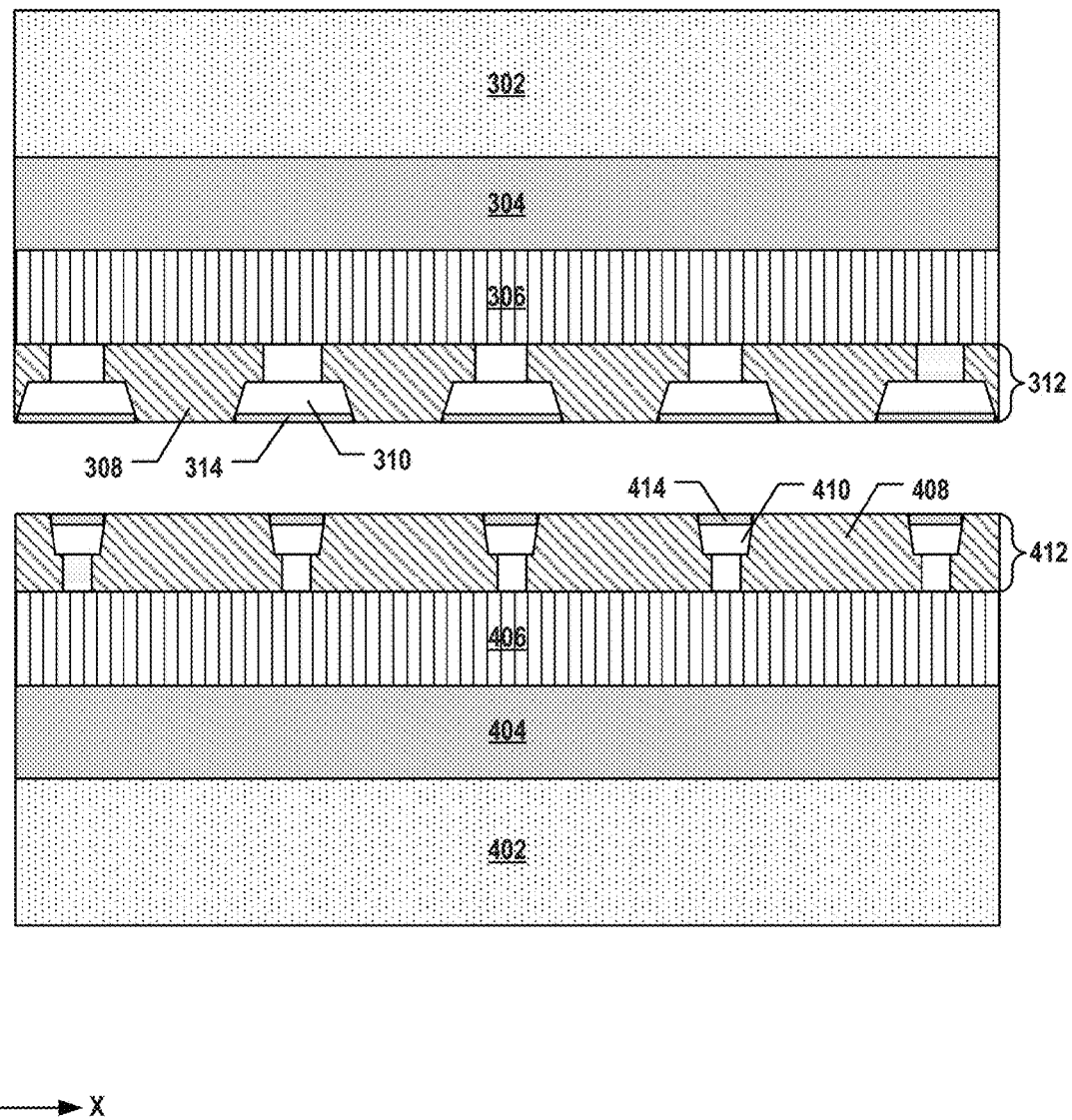
FIGS. 5A-5B illustrate an exemplary fabrication process for bonding the first semiconductor structure and the second semiconductor structure, according to some embodiments of the present disclosure.
Figure 5B:
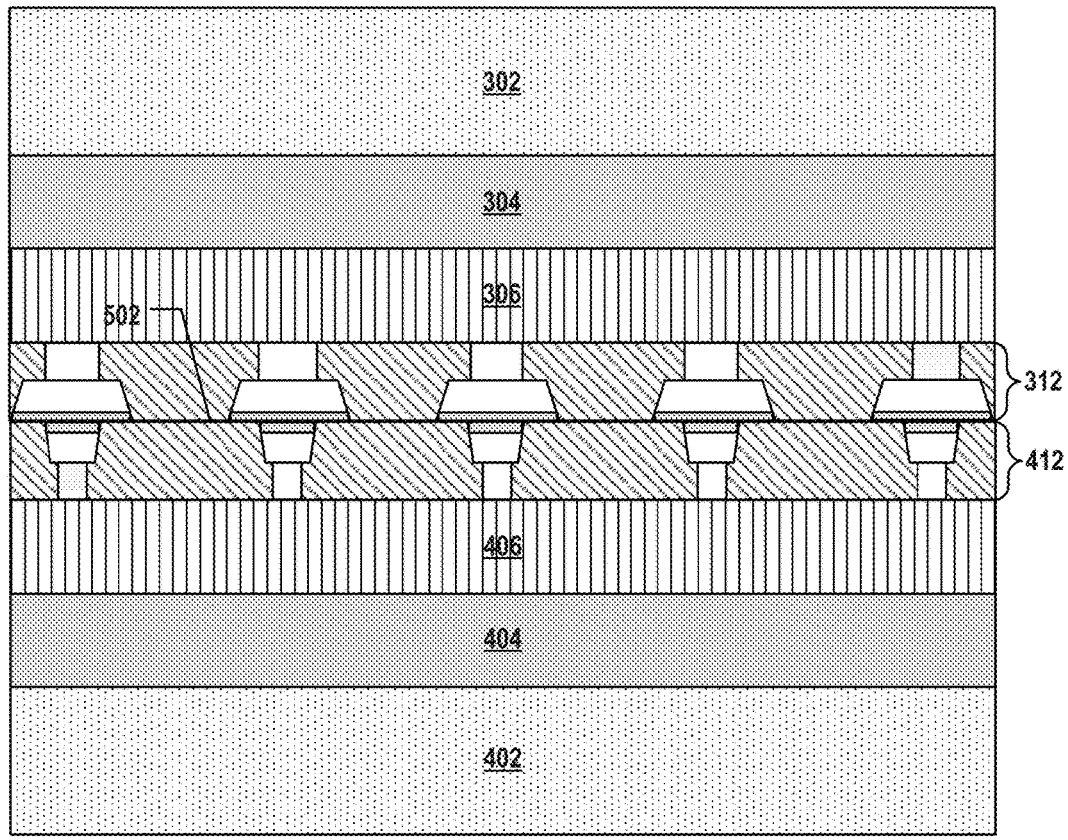
Figure 6:
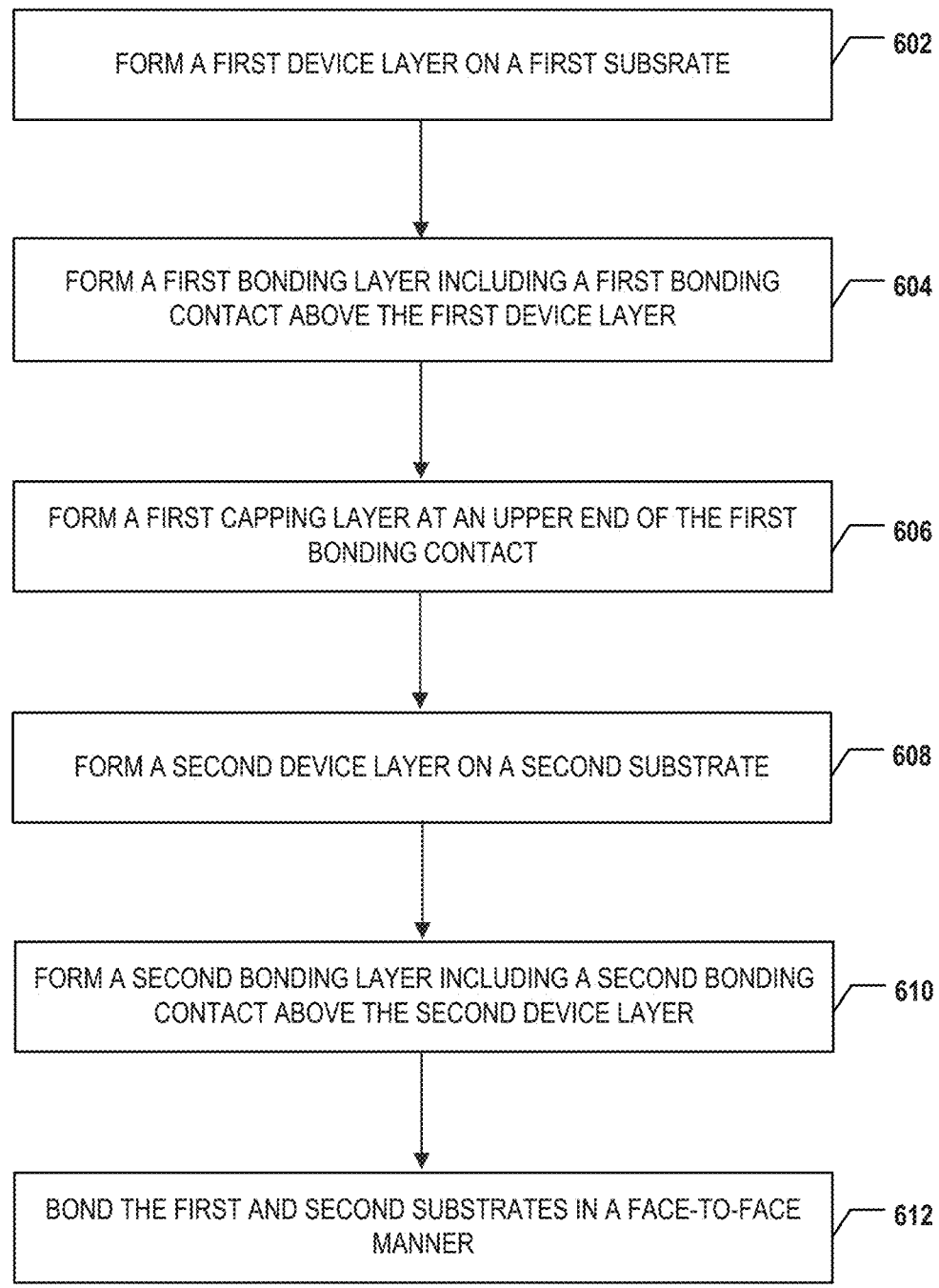
FIG. 6 is a flowchart of a method for forming an exemplary semiconductor device including bonding contacts having a capping layer, according to some embodiments of the present disclosure.

FIGS. 3A-3D illustrate an exemplary fabrication process for forming a first semiconductor structure including bonding contacts having a capping layer, according to some embodiments. FIGS. 4A-4D illustrate an exemplary fabrication process for forming a second semiconductor structure including bonding contacts having a capping layer, according to some embodiments. FIGS. 5A-5B illustrate an exemplary fabrication process for bonding the first semiconductor structure and the second semiconductor structure, according to some embodiments. FIG. 6 is a flowchart of a method 600 for forming an exemplary semiconductor device including bonding contacts having a capping layer, according to some embodiments. Examples of the semiconductor device depicted in FIGS. 3-6 include semiconductor device 100 depicted in FIG. 1. FIGS. 3-6 will be described together. It is understood that the operations shown in method 600 are not exhaustive and that other operations can be performed as well before, after, or between any of the illustrated operations. Further, some of the operations may be performed simultaneously, or in a different order than shown in FIGS. 3-6.

Referring to FIG. 6, method 600 starts at operation 602, in which a first device layer is formed on a first substrate. The first substrate can be a silicon substrate. As illustrated in FIG. 3A, a device layer 304 is formed above a silicon substrate 302. Device layer 304 can be a memory array device layer including a plurality of NAND memory strings (not shown) each extending vertically through a memory stack (not shown) formed on silicon substrate 302.

To form the memory stack, a dielectric stack including an alternating stack of sacrificial layers (e.g., silicon nitride) and dielectric layers (e.g., silicon oxide) can be formed on silicon substrate 302 by one or more thin film deposition processes including, but not limited to, CVD, physical vapor deposition (PVD), atomic layer deposition (ALD), or any combination thereof. The memory stack then can be formed on silicon substrate 302 by gate replacement processes, i.e., replacing the sacrificial layers in the dielectric stack with conductor layers. In some embodiments, fabrication processes to form the NAND memory strings include forming a semiconductor channel that extends vertically through the dielectric stack, forming a composite dielectric layer (memory film) between the semiconductor channel and the dielectric stack, including, but not limited to, a tunneling layer, a storage layer, and a blocking layer. The semiconductor channel and the memory film can be formed by one or more thin film deposition processes such as ALD, CVD, PVD, any other suitable processes, or any combination thereof.

As illustrated in FIG. 3A, an array interconnect layer 306 can be formed above memory array device layer 304. Array interconnect layer 306 can include interconnects (not shown), including interconnect lines and via contacts in a plurality of ILD layers, to make electrical connections with memory array device layer 304. In some embodiments, array interconnect layer 306 includes multiple ILD layers and interconnects therein formed by multiple processes. For example, the interconnects can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 600 proceeds to operation 604, as illustrated in FIG. 6, in which a first bonding layer including a first bonding contact is formed above the first device layer. A first dielectric can be formed in the first bonding layer as well. As illustrated in FIG. 3B, a dielectric 308 is deposited on the top surface of array interconnect layer 306 by one or more thin film deposition processes including, but not limited to, CVD, PVD, ALD, or any combination thereof. As illustrated in FIG. 3C, bonding contacts 310 are formed in dielectric 308 to form a bonding layer 312 above array interconnect layer 306 and memory array device layer 304. Bonding contact 310 can be formed in multiple processes. For example, bonding contact 310 can include a barrier/adhesion layer and a conductor deposited subsequently in this order by one or more thin film deposition processes including, but not limited to, CVD, PVD, ALD, electrochemical depositions, or any combination thereof. Fabrication processes to form bonding contact 310 can also include photolithography, CMP, wet/dry etch, or any other suitable processes, to pattern and etch an opening (e.g., a via hole and/or a trench) in which the barrier/adhesion layer and conductor can be deposited.

Method 600 proceeds to operation 606, as illustrated in FIG. 6, in which a first capping layer is formed at an upper end of the first bonding contact. The first capping layer can have a conductive material different from the remainder of the first bonding contact. Forming the first capping layer can include etching a recess at the upper end of the first bonding contact, and selectively depositing the conductive material in the recess. In some embodiments, the conductive material of the first capping layer includes cobalt, and the remainder of the first bonding contact includes copper. In some embodiments, the thickness of the first capping layer is formed between about 1 nm and about 5 nm.

Figure 3D:
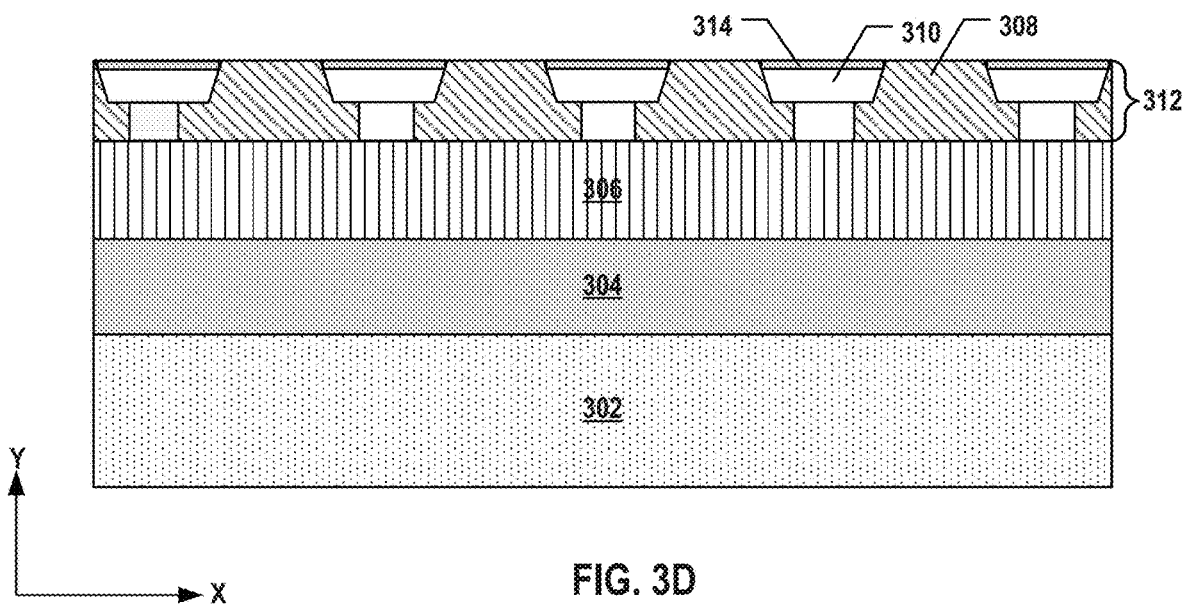

As illustrated in FIG. 3D, a capping layer 314 is formed at the upper end of bonding contact 310 in bonding layer 312. The width of capping layer 314 is nominally the same as the width of bonding contact 310 on its top surface, according to some embodiments. To form capping layer 314, a recess can be etched by wet/dry etching and/or CMP and filled by selectively depositing a conductive material in the recess using one or more thin film deposition processes including, but not limited to, CVD, PVD, ALD, electrochemical depositions, or any combination thereof. In some embodiments, the selectivity of the conductive material of capping layer 314 is greater on the remainder of bonding contact 310 than on dielectric 308, such that the conductive material is deposited only in the recess exposing the conductor of bonding contact 310, but not on dielectric 308.

Figure 7:
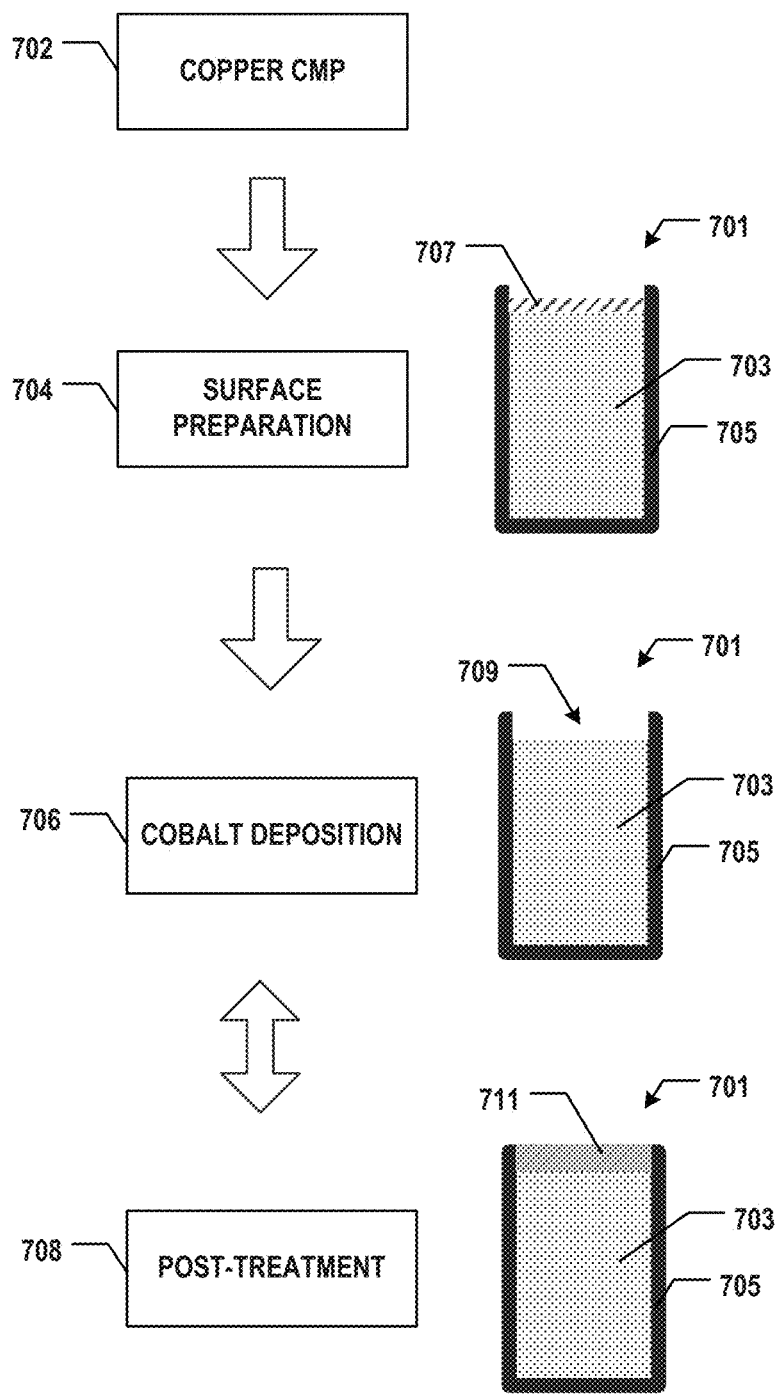
FIG. 7 illustrates an exemplary fabrication process for forming a selective chemical vapor deposition (CVD) cobalt (Co) capping layer for hybrid bonding, according to some embodiments of the present disclosure.

FIG. 7 illustrates an exemplary fabrication process 700 for forming a selective CVD cobalt capping layer 711 for hybrid bonding, according to some embodiments. Capping layer 711 can be one example of capping layer 314 in FIG. 3D, and fabrication process 700 can be one example of operation 606 in FIG. 6. A bonding contact 701 can include a copper conductor 703 and a barrier/adhesion layer 705 (e.g., including Ta/TaN or Ti/TiN) along the sidewalls and the bottom surface of copper conductor 703. In some embodiments, copper conductor 703 can be formed using a damascene process, which involves a copper CMP process 702 to planarize the top surface of bonding contact 701. Copper CMP process 702 can create dishing at the upper end of bonding contact 701, and the top surface of copper conductor 703 can be oxidized thereby forming a copper oxide layer 707 when exposed in the air. That is, the top surface of copper conductor 703 can be below the top surface of barrier/adhesion layer 705, leaving a space for forming capping layer 711, as shown in FIG. 7.

A surface preparation process 704 can then be performed to remove copper oxide layer 707, for example, by applying thermal annealing and/or plasma treatment to the top surface of bonding contact 701. As shown in FIG. 7, a recess 709 can be etched at the upper end of copper conductor 703 by copper CMP process 702 (to form the dishing) and/or surface preparation process 704 (to remove copper oxide layer 707, i.e., oxide removal).

A cobalt deposition process 706 in conjunction with a post-treatment process 708 can then be performed to selectively deposit cobalt capping layer 711 to fill in recess 709, e.g., only on the top surface of copper conductor 703. In some embodiments, cobalt precursors (e.g., bis(cyclopentadienyl)cobalt(II), bis(ethylcyclopentadienyl)cobalt(II), and bis(pentamethylcyclopentadienyl)cobalt(II)) and reaction gases are used for thermal CVD to selectively deposit cobalt on copper conductor 703 followed by plasma treatment (e.g., using ammonia ($NH_3$)) to remove residual carbon to further improve the selectivity of cobalt deposition. The cycle of cobalt deposition process 706 followed by post-treatment process 708 can be repeated until resulting cobalt capping layer 711 fills in recess 709, making the top surface of bonding contact 701 flat. That is, the thickness of cobalt capping layer 711 can be nominally the same as the depth of recess 709.

Referring back to FIG. 6, method 600 further includes operation 608, in which a second device layer is formed above a second substrate. The second substrate can be a silicon substrate. As illustrated in FIG. 4A, a device layer 404 is formed on a silicon substrate 402. Device layer 404 can be a peripheral device layer including a plurality of transistors (not shown) formed on silicon substrate 402 by a plurality of processes including, but not limited to, photolithography, dry/wet etch, thin film deposition, thermal growth, implantation, CMP, and any other suitable processes.

As illustrated in FIG. 4A, a peripheral interconnect layer 406 can be formed above peripheral device layer 404. Peripheral interconnect layer 406 can include interconnects (not shown), including interconnect lines and via contacts in a plurality of ILD layers, to make electrical connections with peripheral device layer 404. In some embodiments, peripheral interconnect layer 406 includes multiple ILD layers and interconnects therein formed by multiple processes. For example, the interconnects can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 600 proceeds to operation 610, as illustrated in FIG. 6, in which a second bonding layer including a second bonding contact is formed above the second device layer. A second dielectric can be formed in the second bonding layer as well. In some embodiments, the width of the first bonding contact at its upper end, which is nominally the same as the width of the first capping layer, is greater than the width of the second bonding contact at its upper end. Thus, a second capping layer may not need to be formed at the upper end of the second bonding contact. Additionally or optionally, a second capping layer can be formed at the upper end of the second bonding contact to further enhance the bonding interface properties as described above in detail. The second capping layer can have a conductive material different from the remainder of the second bonding contact. The width of the first capping layer can be greater than the width of the second capping layer.

Figure 4B:
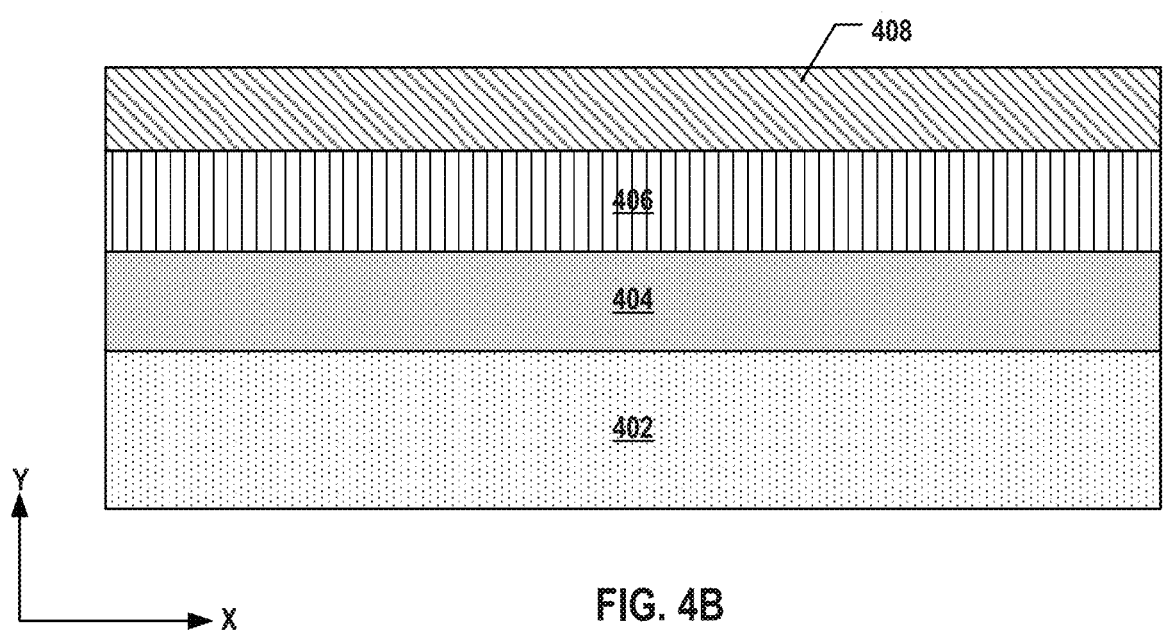
Figure 4C:
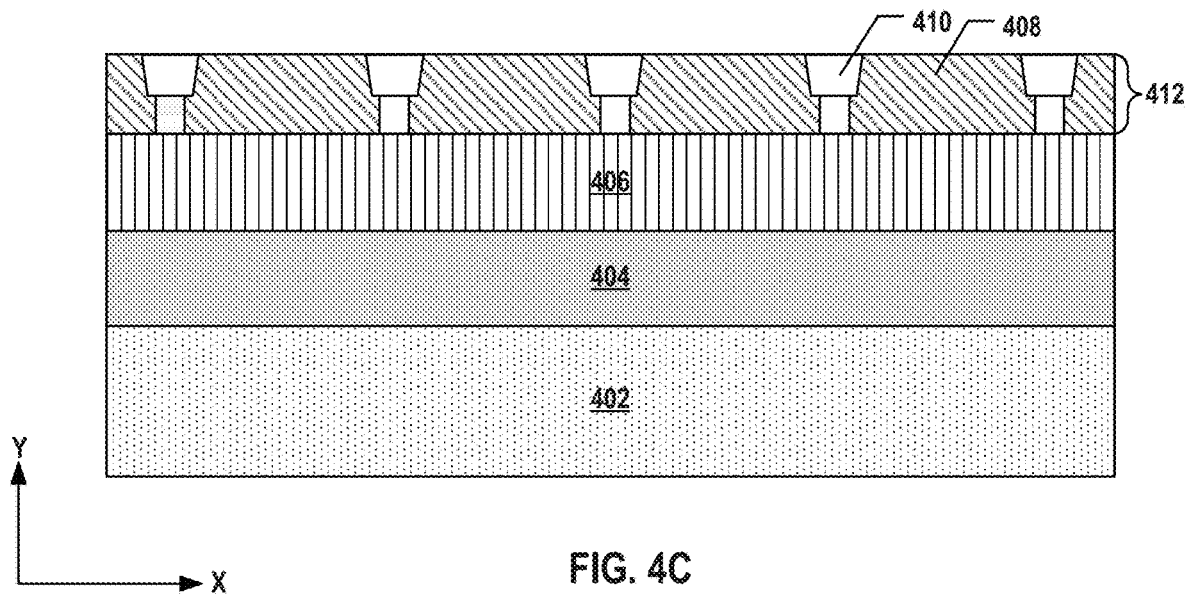

As illustrated in FIG. 4B, a dielectric 408 is deposited on the top surface of peripheral interconnect layer 406 by one or more thin film deposition processes including, but not limited to, CVD, PVD, ALD, or any combination thereof. As illustrated in FIG. 4C, bonding contacts 410 are formed in dielectric 408 to form a bonding layer 412 above peripheral interconnect layer 406 and peripheral device layer 404. Bonding contacts 410 can be formed in multiple processes. For example, each bonding contact 410 can include a barrier/adhesion layer and a conductor deposited subsequently in this order by one or more thin film deposition processes including, but not limited to, CVD, PVD, ALD, electrochemical depositions, or any combination thereof. Fabrication processes to form bonding contacts 410 can also include photolithography, CMP, wet/dry etch, or any other suitable processes, to pattern and etch an opening (e.g., a via hole and/or a trench) in which the barrier/adhesion layer and conductor can be deposited.

Figure 4D:
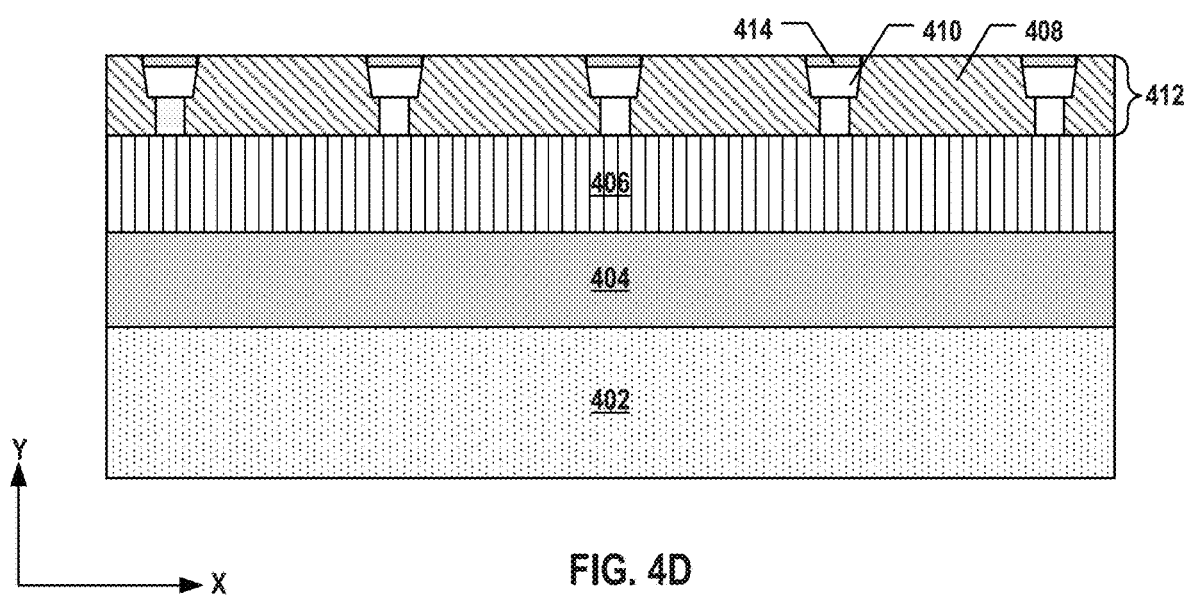

As illustrated in FIG. 4D, a capping layer 414 is formed at the upper end of bonding contact 410 in bonding layer 412. The width of capping layer 414 is nominally the same as the width of bonding contact 410 on its top surface, according to some embodiments. The width of capping layer 314 can be greater than the width of capping layer 414. To form capping layer 414, a recess can be etched by wet/dry etching and/or CMP and filled by selectively depositing a conductive material in the recess using one or more thin film deposition processes including, but not limited to, CVD, PVD, ALD, electrochemical depositions, or any combination thereof. In some embodiments, the selectivity of the conductive material of capping layer 414 is greater on the remainder of bonding contact 410 than on dielectric 408, such that the conductive material is deposited only in the recess exposing the conductor of bonding contact 410, but not on dielectric 408. In some embodiments, capping layer 414 is formed by fabrication process 700 illustrated above in detail with respect to FIG. 7.

Method 600 proceeds to operation 612, as illustrated in FIG. 6, in which the first substrate and the second substrate are bonded in a face-to-face manner, so that the first bonding contact is in contact with the second bonding contact by the first capping layer. The first dielectric can be in contact with the second dielectric as well after the bonding. In some embodiments in which the second capping layer is formed at the upper end of the second bonding contact, the first bonding contact is in contact with the second bonding contact by the first capping layer and the second capping layer after the bonding. The bonding can be hybrid bonding.

As illustrated in FIG. 5A, silicon substrate 302 and memory array device layer 304 formed thereon are flipped upside down. Bonding layer 312 facing down is to be bonded with bonding layer 412 facing up, i.e., in a face-to-face manner. In some embodiments, bonding contacts 410 are aligned with bonding contacts 310 prior to hybrid bonding, so that bonding contacts 410 are in contact with bonding contacts 310 by capping layers 314 and 414 after the hybrid bonding, according to some embodiments. In some embodiments, a treatment process, e.g., a plasma treatment, a wet treatment, and/or a thermal treatment, is applied to the bonding surfaces prior to the hybrid bonding. As a result of the hybrid bonding, bonding contacts 410 (e.g., capping layers 414 thereof) can be inter-mixed with bonding contacts 310 (e.g., capping layer 314 thereof), and dielectric 408 can be covalent-bonded with dielectric 308, thereby forming a bonding interface 502 between bonding layer 412 and bonding layer 312, as shown in FIG. 5B.

It is understood that although memory array device layer 304 is flipped upside down and is above peripheral device layer 404 in the resulting semiconductor device as shown in FIG. 5B, in some embodiments, peripheral device layer 404 is flipped upside down and is above memory array device layer 304 in the resulting semiconductor device. It is further understood that although device layer 304 is illustrated as a memory array device layer and device layer 404 is illustrated as a peripheral device layer, the examples are for illustrative purposes only and do not limit the embodiments of present disclosure. In one example, device layer 304 can be a peripheral device layer, and device layer 404 can be a memory array device layer. In another example, device layers 304 and 404 can be both peripheral device layers. In still another example, device layers 304 and 404 can be both memory array device layers.

According to one aspect of the present disclosure, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact. The second semiconductor structure includes a second device layer, and a second bonding layer disposed below the second device layer and including a second bonding contact. The first bonding contact is in contact with the second bonding contact at the bonding interface. At least one of the first bonding contact and the second bonding contact includes a capping layer at the bonding interface and having a conductive material different from a remainder of the respective first or second bonding contact.

In some embodiments, the conductive material of the capping layer includes cobalt, and the remainder of the respective first or second bonding contact includes copper. In some embodiments, a thickness of the capping layer is between about 1 nm and about 5 nm. In some embodiments, a selectivity of the conductive material of the capping layer is greater on the remainder of the respective first or second bonding contact than on the first or second dielectric.

In some embodiments, a width of the second bonding contact is greater than a width of the first bonding contact at the bonding interface, and the second bonding contact includes the capping layer. A width of the capping layer can be nominally the same as the width of the second bonding contact at the bonding interface. In some embodiments, a width of the first bonding contact is greater than a width of the second bonding contact at the bonding interface, and the first bonding contact includes the capping layer. A width of the capping layer can nominally the same as the width of the first bonding contact at the bonding interface. In some embodiments, each of the first and second bonding contacts includes the respective capping layer.

In some embodiments, the first bonding layer further includes a first dielectric, and the second bonding layer further includes a second dielectric in contact with the first dielectric at the bonding interface.

In some embodiments, one of the first device layer and the second device layer includes a NAND memory string, and another one of the first device layer and the second device layer includes a peripheral device.

According to another aspect of the present disclosure, a bonded structure includes a first bonding layer including a first bonding contact and a first dielectric, a second bonding layer including a second bonding contact and a second dielectric, and a bonding interface between the first bonding layer and the second bonding layer. The first bonding contact is in contact with the second bonding contact at the bonding interface, and the first dielectric is in contact with the second dielectric at the bonding interface. At least one of the first bonding contact and the second bonding contact includes a capping layer at the bonding interface and having a conductive material different from a remainder of the respective first or second bonding contact.

In some embodiments, the conductive material of the capping layer includes cobalt, and the remainder of the respective first or second bonding contact includes copper. In some embodiments, a thickness of the capping layer is between about 1 nm and about 5 nm. In some embodiments, a selectivity of the conductive material of the capping layer is greater on the remainder of the respective first or second bonding contact than on the first or second dielectric.

In some embodiments, a width of the second bonding contact is greater than a width of the first bonding contact at the bonding interface, and the second bonding contact includes the capping layer. A width of the capping layer can be nominally the same as the width of the second bonding contact at the bonding interface. In some embodiments, a width of the first bonding contact is greater than a width of the second bonding contact at the bonding interface, and the first bonding contact includes the capping layer. A width of the capping layer can nominally the same as the width of the first bonding contact at the bonding interface. In some embodiments, each of the first and second bonding contacts includes the respective capping layer.

According to still another aspect of the present disclosure, a method for forming a semiconductor device is disclosed. A first device layer is formed on a first substrate. A first bonding layer including a first bonding contact is formed above the first device layer. A first capping layer is formed at an upper end of the first bonding contact. The first capping layer has a conductive material different from a remainder of the first bonding contact. A second device layer is formed on a second substrate. A second bonding layer including a second bonding contact is formed above the second device layer. The first substrate and the second substrate are bonded in a face-to-face manner, so that the first bonding contact is in contact with the second bonding contact by the first capping layer.

In some embodiments, a second capping layer is formed at an upper end of the second bonding contact. The second capping layer can have a conductive material different from a remainder of the second bonding contact. The first bonding contact can be in contact with the second bonding contact by the first capping layer and the second capping layer after the bonding.

In some embodiments, to form the first capping layer, a recess is etched at the upper end of the first bonding contact, and the conductive material is selectively deposited in the recess. Etching of the recess includes CMP followed by oxide removal, according to some embodiments. The selective deposition of the conductive material includes a plurality cycles of CVD and plasma treatment.

In some embodiments, the conductive material of the capping layer includes cobalt, and the remainder of the respective first or second bonding contact includes copper. In some embodiments, a thickness of the capping layer is between about 1 nm and about 5 nm. In some embodiments, a width of the first capping layer is greater than a width of the second bonding contact.

In some embodiments, a first dielectric is formed in the first bonding layer, a second dielectric is formed in the second bonding layer, and the first dielectric is in contact with the second dielectric after the bonding.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device, comprising:
    a first semiconductor structure comprising a substrate, a first device layer disposed on the substrate, and a first bonding layer disposed above the first device layer and comprising a first dielectric and a plurality of first bonding contacts, wherein each first bonding contact comprises a first conductor and a first adhesion layer between the first conductor and the first dielectric;
    a second semiconductor structure comprising a second device layer, and a second bonding layer disposed below the second device layer and comprising a second dielectric and a plurality of second bonding contacts, wherein each second bonding contact comprises a second conductor and a second adhesion layer between the second conductor and the second dielectric; and
    a bonding interface between the first semiconductor structure and the second semiconductor structure,
    wherein each first bonding contact is in contact with a corresponding second bonding contact at the bonding interface, and the plurality of first bonding contacts and the plurality of corresponding second bonding contacts have a one-to-one correspondence and are the only bonding contacts at the bonding interface,
    each first bonding contact and each second bonding contact further comprise a respective capping layer, at the bonding interface, the respective capping layer having a conductive material different from the respective conductor and the respective adhesion layer of the respective first or second bonding contact,
    a top surface of the respective conductor is below a top surface of the respective adhesion layer, and each first capping layer and second capping layer fills in between two sides of the respective adhesion layer and above the respective conductor and has a top surface coplanar with a top surface of the respective dielectric in the respective bonding layer,
    a top surface of each first capping layer, filling in between two sides of the respective first adhesion layer and above the respective first conductor, is in contact with a top surface of a corresponding second capping layer filling in between two sides of the respective second adhesion layer and above the respective second conductor,
    a width of each first capping layer is greater than a width of the corresponding second capping layer at the bonding interface, such that each first capping layer covers an entirety of the width of the corresponding second capping layer and extends beyond each side of the corresponding second capping layer,
    each of the first capping layer and the corresponding second capping layer is a cobalt metal layer, and the respective conductive material is cobalt,
    the cobalt metal layer is formed by a cycle of cobalt deposition and residual carbon removal processes, and
    the residual carbon removal process is configured to remove residual carbon to increase a selectivity of the cobalt deposition.

2. The semiconductor device of claim 1, wherein the respective conductor of each first or second bonding contact comprises copper.

3. The semiconductor device of claim 1, wherein a width of each second capping layer is nominally the same as a width of a corresponding second bonding contact at the bonding interface.

4. The semiconductor device of claim 1, wherein the width of each first capping layer is nominally the same as a width of a corresponding first bonding contact at the bonding interface.

5. The semiconductor device of claim 1, wherein a thickness of each first or second capping layer is between about 1 nm and about 5 nm.

6. The semiconductor device of claim 1, wherein the second dielectric is in contact with the first dielectric at the bonding interface.

7. The semiconductor device of claim 6, wherein the selectivity of the cobalt deposition is greater on the conductor of the respective first or second bonding contact than on the first or second dielectric.

8. The semiconductor device of claim 1, wherein a thickness of each first capping layer is different from a thickness of the corresponding second capping layer.

9. A bonded structure, comprising:
    a first semiconductor structure, comprising a memory array device layer and a first bonding layer comprising a plurality of first bonding contacts and a first dielectric, wherein each first bonding contact comprises a first conductor and a first adhesion layer between the first conductor and the first dielectric;
    a second semiconductor structure, comprising a peripheral device layer and a second bonding layer comprising a plurality of second bonding contacts and a second dielectric, wherein each second bonding contact comprises a second conductor and a second adhesion layer between the second conductor and the second dielectric; and
    a bonding interface between the first bonding layer of the first semiconductor structure and the second bonding layer of the second semiconductor structure,
    wherein each first bonding contact is in contact with a corresponding second bonding contact at the bonding interface, the first dielectric is in contact with the second dielectric at the bonding interface, and the plurality of first bonding contacts and the plurality of corresponding second bonding contacts have a one-to-one correspondence and are the only bonding contacts at the bonding interface,
    a top surface of the respective conductor is below a top surface of the respective adhesion layer, and each first capping layer and second capping layer fills in between two sides of the respective adhesion layer and above the respective conductor and has a top surface coplanar with a top surface of the respective dielectric in the respective bonding layer, each first bonding contact and each second bonding contact further comprises a respective capping layer, at the bonding interface, the respective capping layer having a conductive material different from the respective conductor and the respective adhesion layer of the respective first or second bonding contact, a top surface of each first capping layer, filling in between two sides of the respective first adhesion layer and above the respective first conductor, is in contact with a top surface of a corresponding second capping layer filling in between two sides of the respective second adhesion layer and above the respective second conductor, a width of each first capping layer is greater than a width of a corresponding second capping layer at the bonding interface, such that each first capping layer covers an entirety of the width of the corresponding second capping layer and extends beyond each side of the corresponding second capping layer, each first capping layer and second capping layer is formed in a recess of the respective conductor, and the recess is processed with a surface treatment configured to remove a layer of oxide from the recess after the recess is formed by chemical mechanical polishing.

10. The bonded structure of claim 9, wherein the conductive material of each first capping layer and each second capping layer is cobalt, and the remainder of the respective first or second bonding contact comprises copper.

11. The bonded structure of claim 9, wherein a selectivity of the respective conductive material of each first capping layer and each second capping layer is greater on the respective conductor of the respective first or second bonding contact than on the first or second dielectric.

12. The bonded structure of claim 9, wherein a thickness of each first capping layer is different from a thickness of the corresponding second capping layer.

13. A semiconductor device, comprising:
a first semiconductor structure comprising a substrate, a first device layer, and a first bonding layer comprising a first dielectric and a plurality of first bonding contacts, wherein each first bonding contact comprises a first conductor and a first adhesion layer between the first conductor and the first dielectric, wherein the first device layer comprises NAND memory strings that extend vertically through a plurality of pairs each comprising a conductor layer and a dielectric layer, and the first device layer further comprises a semiconductor layer disposed above and in contact with the NAND memory strings, and an interconnect layer disposed above and in contact with the semiconductor layer;
a second semiconductor structure comprising a second device layer and a second dielectric and a plurality of second bonding contacts, wherein each second bonding contact comprises a second conductor and a second adhesion layer between the second conductor and the second dielectric, and wherein the second device layer comprises peripheral circuits configured to facilitate operations of the NAND memory strings; and
a bonding interface between the first semiconductor structure and the second semiconductor structure,
wherein each first bonding contact is in contact with a corresponding second bonding contact at the bonding interface, and the plurality of first bonding contacts and the plurality of corresponding second bonding contacts have a one-to-one correspondence and are the only bonding contacts at the bonding interface,
a top surface of the respective conductor is below a top surface of the respective adhesion layer, and each first capping layer and second capping layer fills in between two sides of the respective adhesion layer and above the respective conductor and has a top surface coplanar with a top surface of the respective dielectric in the respective bonding layer,
each first bonding contact and each second bonding contact further comprise a respective capping layer, at the bonding interface, the respective capping layer having a conductive material different from the respective conductor and the respective adhesion layer of the respective first or second bonding contact,
a top surface of each first capping layer, filling in between two sides of the respective first adhesion layer and above the respective first conductor, is in contact with a top surface of a corresponding second capping layer filling in between two sides of the respective second adhesion layer and above the respective second conductor, and
a width of each first capping layer is greater than a width of the corresponding second capping layer at the bonding interface, such that each first capping layer covers an entirety of the width of the corresponding second capping layer and extends beyond each side of the corresponding second capping layer.

14. The semiconductor device of claim 13, wherein each first capping layer and second capping layer is a cobalt metal layer, and the respective conductive material is cobalt.

15. The semiconductor device of claim 13, wherein the respective conductor of the respective first or second bonding contact comprises copper.

16. The semiconductor device of claim 13, wherein a selectivity of the respective conductive material of each first capping layer and second capping layer is greater on the remainder of the respective first or second bonding contact than on the first or second dielectric.

17. The semiconductor device of claim 13, wherein a thickness of each first capping layer is different from a thickness of the corresponding second capping layer.

* * * * *